US012633332B1

(12) United States Patent
Hunt-Schroeder et al.

(10) Patent No.: US 12,633,332 B1
(45) Date of Patent: May 19, 2026

(54) RECONFIGURABLE BITCELL FOR PUF KEY GENERATION

(71) Applicant: Marvell Asia Pte Ltd, Singapore (SG)

(72) Inventors: Eric Hunt-Schroeder, Essex Junction, VT (US); Tian Xia, Burlington, VT (US)

(73) Assignee: Marvell Asia Pte Ltd, Singapore (SG)

( * ) Notice: Subject to any disclaimer, the term of this patent is extended or adjusted under 35 U.S.C. 154(b) by 194 days.

(21) Appl. No.: 18/540,411

(22) Filed: Dec. 14, 2023

Related U.S. Application Data

(60) Provisional application No. 63/432,847, filed on Dec. 15, 2022.

(51) Int. Cl.
 *G11C 11/4078* (2006.01)
 *G11C 11/4091* (2006.01)
 *G11C 11/4096* (2006.01)
(52) U.S. Cl.
 CPC ...... *G11C 11/4078* (2013.01); *G11C 11/4091* (2013.01); *G11C 11/4096* (2013.01)
(58) Field of Classification Search
 CPC ............ G11C 11/4078; G11C 11/4091; G11C 11/4096
 See application file for complete search history.

(56) References Cited

U.S. PATENT DOCUMENTS

| | | | |
|---|---|---|---|
| 5,515,540 A | 5/1996 | Grider et al. | |
| 5,736,777 A | 4/1998 | Shield et al. | |
| 6,588,672 B1 | 7/2003 | Usami | |
| 9,406,375 B1 * | 8/2016 | Barowski | G11C 11/418 |
| 9,837,168 B1 * | 12/2017 | Fifield | G11C 17/18 |
| 10,163,490 B2 * | 12/2018 | Nguyen | G11C 11/412 |
| 11,145,344 B1 * | 10/2021 | Lu | G11C 17/16 |

(Continued)

FOREIGN PATENT DOCUMENTS

| | | | |
|---|---|---|---|
| CN | 204291000 U | * | 4/2015 |
| CN | 205281504 U | | 6/2016 |
| JP | 2017163030 | | 9/2017 |

OTHER PUBLICATIONS

Katzenbeisser, et al. (2011). Recyclable pufs: Logically reconfigurable pufs. Journal of Cryptographic Engineering, 1(3), 177-186. (Year: 2011).*

(Continued)

*Primary Examiner* — Philip J Chea
*Assistant Examiner* — Dorianne Alvarado David

(57) ABSTRACT

A method of generating a physical unclonable function (PUF) key uses a value read from an array of bitcells in rows defined by pairs of true and complement wordlines and columns defined by pairs of true and complement bitlines, each bitcell having a pull-up network coupled to a complement wordline and to the true and complement bitlines, and having a pull-down network coupled to a true wordline and to the true and complement bitlines. A pull-up network of a first bitcell is activated by the complement wordline. A pull-down network of a second bitcell is activated by the true wordline. A first value based on the pull-up network of the first bitcell and the pull-down network of the second bitcell is read using a sense amplifier coupled to a true bitline and a complement bitline. A PUF key is generated using the first value.

17 Claims, 6 Drawing Sheets

300

(56) References Cited

U.S. PATENT DOCUMENTS

| | | | |
|---|---|---|---|
| 2012/0179952 A1* | 7/2012 | Tuyls | H04L 9/0866 |
| | | | 711/E12.078 |
| 2013/0083591 A1* | 4/2013 | Wuu | H10B 10/12 |
| | | | 365/154 |
| 2014/0204656 A1* | 7/2014 | Kumar | G11C 11/419 |
| | | | 365/154 |
| 2015/0092777 A1 | 4/2015 | Watanabe | |
| 2016/0301534 A1* | 10/2016 | Chen | G06F 12/1408 |
| 2017/0142082 A1 | 5/2017 | Qian | |
| 2017/0142090 A1 | 5/2017 | Mahaffey et al. | |
| 2017/0201382 A1 | 7/2017 | Lindteigen | |
| 2018/0013431 A1* | 1/2018 | Bury | H01L 21/326 |
| 2018/0013562 A1 | 1/2018 | Auh | |
| 2018/0075262 A1 | 3/2018 | Haider et al. | |
| 2018/0137293 A1 | 5/2018 | Lucas et al. | |
| 2018/0159685 A1 | 6/2018 | Kwak | |
| 2018/0191512 A1* | 7/2018 | Tomishima | G09C 1/00 |
| 2018/0278418 A1 | 9/2018 | Chang et al. | |
| 2019/0042199 A1* | 2/2019 | Sumbul | G11C 8/10 |
| 2019/0140851 A1 | 5/2019 | Ma et al. | |
| 2019/0221254 A1* | 7/2019 | Liu | H04L 9/3278 |
| 2020/0044871 A1* | 2/2020 | Lu | G11C 11/419 |
| 2020/0052912 A1* | 2/2020 | Lu | H04L 9/30 |
| 2020/0084052 A1* | 3/2020 | O'Connell | G11C 7/24 |
| 2020/0136839 A1* | 4/2020 | Tsai | G11C 11/417 |
| 2020/0145008 A1* | 5/2020 | Strukov | G11C 16/0425 |
| 2020/0342921 A1* | 10/2020 | Jiang | G11C 8/16 |
| 2020/0350264 A1 | 11/2020 | Park | |
| 2021/0082532 A1* | 3/2021 | Hunt-Schroeder | G11C 7/065 |
| 2021/0110853 A1* | 4/2021 | Gupta | G11C 13/004 |
| 2022/0020706 A1* | 1/2022 | Plouchart | H01L 23/573 |
| 2022/0191223 A1 | 6/2022 | Zifroni et al. | |
| 2022/0284942 A1* | 9/2022 | Srinivasa | G11C 7/1048 |
| 2022/0385486 A1* | 12/2022 | Chung | G11C 17/16 |

OTHER PUBLICATIONS

Kursawe, et al. (Jul. 2009). Reconfigurable physical unclonable functions-enabling technology for tamper-resistant storage. In 2009 IEEE International Workshop on Hardware-Oriented Security and Trust (pp. 22-29). IEEE. (Year: 2009).*

Liu, et al. (2020). A 373-F 2 0.21%-Native-BER EE SRAM Physically Unclonable Function With 2-D Power-Gated Bit Cells and VSS Bias-Based Dark-Bit Detection. IEEE Journal of Solid-State Circuits, 55(6), 1719-1732. (Year: 2020).*

Zhang, et al. (2014). Exploiting process variations and programming sensitivity of phase change memory for reconfigurable physical unclonable functions. IEEE Transactions on Information Forensics and Security, 9(6), 921-932. (Year: 2014).*

Herder, C., et al., "Physical Unclonable Functions and Applications: A Tutorial," *2014 Proceedings of the IEEE*, vol. 102, No. 8, pp. 1126-1141 (Aug. 8, 2014).

Hunt-Schroeder, E., et al., "Pre-Amplifier Based Entropy Source with Stable Output for use in a Physical Unclonable Function," *2021 IEEE Microelectronics Design & Test Symposium (MDTS)*, pp. 1-6 (May 18-21, 2021).

Hunt-Schroeder, E., et al., "Integrating Physical Unclonable Function and Self-Destruction Design to Safeguard Integrated Circuit," *GOMACTech 2022*, pp. 1-6 (Mar. 21-24, 2022).

* cited by examiner

RECONFIGURABLE BITCELL FOR PUF KEY GENERATION

CROSS REFERENCE TO RELATED APPLICATIONS

This disclosure claims the benefit of commonly-assigned U.S. Provisional Patent Application No. 63/432,847, filed Dec. 15, 2022, which is hereby incorporated by reference herein in its entirety.

FIELD OF USE

This disclosure relates to physical unclonable function (PUF) key generation. More particularly, this disclosure relates to a reconfigurable bitcell array for reading values for PUF key generation.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

Physical Unclonable Functions (PUFs) generate secure encryption keys for a semiconductor device based on intrinsic process variations in the fabrication of the device. PUFs are used for chip authentication through a random, unique, and repeatable on-chip secret key that is generated on request.

SUMMARY

In accordance with implementations of the subject matter of this disclosure, a method of generating a physical unclonable function (PUF) key, using a value read from an array of bitcells, includes arranging the array of bitcells in respective rows defined by respective pairs of true and complement wordlines and in columns defined by respective pairs of true and complement bitlines, each bitcell in the array of bitcells having a pull-up network coupled to one of the complement wordlines and to the true and complement bitlines, and having a pull-down network coupled to one of the true wordlines and to the true and complement bitlines, activating a pull-up network of a first bitcell in the array of bitcells by activating a first complement wordline corresponding to the pull-up network, activating a pull-down network of a second bitcell in the array of bitcells by activating a first true wordline corresponding to the pull-down network, wherein the second bitcell is different from the first bitcell, reading a first value based on the pull-up network of the first bitcell and the pull-down network of the second bitcell using a sense amplifier coupled to a first true bitline and a first complement bitline, and generating a first PUF key using the first value.

In a first implementation of such a method, the first bitline and the first complement bitline may be members of one respective pair of true and complement bitlines.

In a second implementation of such a method, the first true bitline may be a member of a first respective pair of true and complement bitlines, and the first complement bitline may be a member of a second respective pair of true and complement bitlines.

A third implementation of such a method may further include, after generating the first PUF key using the first value, activating the pull-up network of the first bitcell in the array of bitcells by activating the first complement wordline corresponding to the pull-up network, activating a pull-down network of a third bitcell in the array of bitcells by activating a second true wordline corresponding to the pull-down network, wherein the third bitcell is different from the first and second bitcells, reading a second value based on the pull-up network of the first bitcell and the pull-down network of the third bitcell using a sense amplifier coupled to a first true bitline and a first complement bitline, and generating a second PUF key using the second value.

A first aspect of that third implementation may further include determining, by the sense amplifier, that only one of the first value and the second value is stable.

A fourth implementation of such a method may further include measuring the contribution of each pull-up network of each bitcell in the array and the contribution of each pull-down network of each bitcell in the array to determine which complement wordline corresponding to a pull-up network and which true wordline corresponding to a pull-down network to activate at the same time to generate a bit value.

A first aspect of that fourth implementation may further include determining that the pull-up network of the first bitcell and the pull-down network of the second bitcell have contributions within a threshold level of each other, and selecting the pull-up network of the first bitcell and the pull-down network of the second bitcell.

According to a second aspect of that fourth implementation, measuring the contribution of each pull-up network of each bitcell in the array and the contribution of each pull-down network of each bitcell in the array may include measuring the voltage of each pull-up network of each bitcell in the array and the voltage of each pull-down network of each bitcell in the array.

A fifth implementation of such a method may further include activating a pull-up network of a third bitcell in the array of bitcells by activating a second complement wordline corresponding to a pull-up network, where the third bitcell is different from the first and second bitcells, activating a pull-down network of a fourth bitcell in the array of bitcells by activating a second true wordline corresponding to the pull-down network, where the fourth bitcell is different from the first, second, and third bitcells, reading a second value based on the pull-up network of the third bitcell and the pull-down network of the fourth bitcell using a sense amplifier coupled to the first true bitline and the first complement bitline, and when generating the first physical unclonable function (PUF) key, also using the second value.

In accordance with implementations of the subject matter of this disclosure, an entropy source for generating a PUF key includes an array of bitcells arranged in respective rows defined by respective pairs of true and complement wordlines and in columns defined by respective pairs of true and complement bitlines, where each bitcell in the array of bitcells includes a pull-up network coupled to one of the complement wordlines and to the true and complement bitlines, and a pull-down network coupled to one of the true wordlines and to the true and complement bitlines, control circuitry configured to activate a pull-up network of a first bitcell in the array of bitcells by activating a first complement wordline corresponding to the pull-up network, and activate a pull-down network of a second bitcell in the array of bitcells by activating a first true wordline corresponding to the pull-down network, where the second bitcell is different from the first bitcell, a sense amplifier coupled to a first true bitline and a first complement bitline configured to read a first value based on the pull-up network of the first bitcell and the pull-down network of the second bitcell, and key generation circuitry configured to generate a first physical unclonable function (PUF) key using the first value.

A first implementation of such an entropy source may further include multiplexing circuitry configured to couple the sense amplifier to the first true bitline and the first complement bitline.

According to a first aspect of that first implementation, the multiplexing circuitry may further be configured to, when coupling the sense amplifier to the first true bitline and the first complement bitline, select the first true bitline and the first complement bitline such that they are members of one respective pair of true and complement bitlines.

According to a second aspect of that first implementation, the multiplexing circuitry may further be configured to, when coupling the sense amplifier to the first true bitline and the first complement bitline, select the first true bitline such that it is a member of a first respective pair of true and complement bitlines, and select the first complement bitline such that it is a member of a second respective pair of true and complement bitlines.

According to a third aspect of that first implementation, the sense amplifier may further be configured to measure the contribution of each pull-up network of each bitcell in the array and the contribution of each pull-down network of each bitcell in the array to determine which complement wordline corresponding to a pull-up network and true wordline corresponding to a pull-down network to activate at the same time to generate a bit value.

In a first instance of that third aspect, the multiplexing circuitry may further be configured to determine that the pull-up network of the first bitcell and the pull-down network of the second bitcell have contributions within a threshold level of each other, and select the pull-up network of the first bitcell and the pull-down network of the second bitcell.

In a second instance of that third aspect, the sense amplifier may further be configured to, when measuring the contribution of each pull-up network of each bitcell in the array and the contribution of each pull-down network of each bitcell in the array, measure the voltage of each pull-up network of each bitcell in the array and the voltage of each pull-down network of each bitcell in the array.

In a second implementation of such an entropy source, the control circuitry may further be configured to, after generating the first PUF key using the first value, activate the pull-up network of the first bitcell in the array of bitcells by activating the first complement wordline corresponding to the pull-up network, and activate a pull-down network of a third bitcell in the array of bitcells by activating a first true wordline corresponding to the pull-down network, where the third bitcell is different from the first and second bitcells, the sense amplifier may further be configured to read a second value based on the pull-up network of the first bitcell and the pull-down network of the third bitcell, and the key generation circuitry may further be configured to generate a second PUF key using the second value.

According to a first aspect of that second implementation, the sense amplifier may further be configured to determine that only one of the first value and the second value is stable.

In a third implementation of such an entropy source, the control circuitry may further be configured to activate a pull-up network of a third bitcell in the array of bitcells by activating a second complement wordline corresponding to the pull-up network, where the third bitcell is different from the first and second bitcells, and activate a pull-down network of a fourth bitcell in the array of bitcells by activating a second true wordline corresponding to the pull-down network, where the fourth bitcell is different from the first, second, and third bitcells, the sense amplifier further being configured to read a second value based on the pull-up network of the third bitcell and the pull-down network of the fourth bitcell, and the key generation circuitry further being configured to generate the first PUF key also using the second value.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
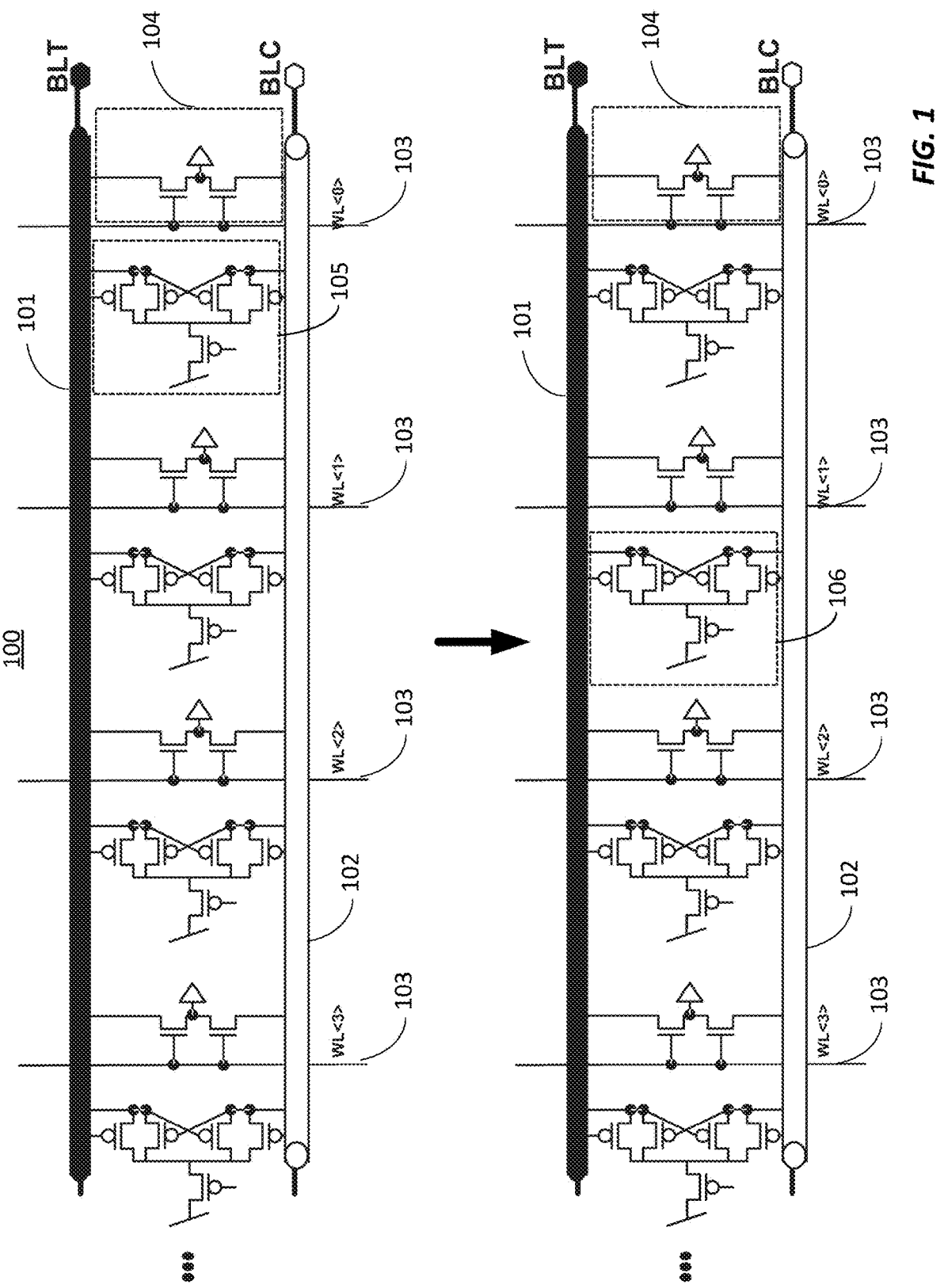
FIG. 1 illustrates regrouping of bitcells within an array along a bitline and complement bitline, in accordance with the subject matter of this disclosure.

There exists a need for a PUF key generated by a reconfigurable bitcell array entropy source. This disclosure describes a PUF capable of being reconfigured for zero array area increase. The new array data is unpredictable and unclonable from knowing the original array data allowing for unique reuse of devices in the array to generate more than one bit of data.

The array of bitcells contains multiple bitcells arranged in an array structure including multiple bitline columns and multiple wordline (WL) rows. Each bitline column includes a true bitline (BLT) and complement bitline (BLC). Each wordline row includes a true wordline and a complement wordline. Each bitcell contains a pull-up network controlled by one of the true wordlines and a pull-down network controlled by one of the complement wordlines. The pull-up network may include a collection of p-type field-effect transistors (PFETs) while the pull-down network may include a collection of n-type field-effect transistors (NFETs) within the bitcell, as described in copending application Ser. No. 17/743,797, filed Feb. 9, 2022, which is hereby incorporated by reference herein in its entirety. Each bitcell utilizes intrinsic properties of components to supply a readable bit, e.g., logic '0' or logic '1'.

In some implementations, the bitcell is composed of seven transistors with three sets of matching pairs: NTRUE with NCOMP, PTRUE with PCOMP, and PTCC with PCCC, as described in copending application Ser. No. 17/305,825, filed Jul. 15, 2021, which is hereby incorporated by reference herein in its entirety. In these implementations, extracting data from the PUF is achieved by activating a wordline generated from an analog voltage generator that tracks with process, voltage, and temperature. The complement wordline transitions between a voltage provided by a power supply (VDD) and 0V to activate the bitcell during reads. Any mismatch or asymmetry in device parameters (e.g., threshold voltage) results in slight differences in transistor drain currents which impacts the value read by the bitcell. Each bitline column may be coupled to sense amplifier circuitry.

In some implementations, each bitline column is associated with a sense amplifier which reads the values of each bitcell in the array and the two bitcells are located along the same bitline column. In a conventional approach, each pull-up network would only be activated with the corresponding pull-down network within the same bitcell. Independent address control of the true wordlines and complement wordlines in accordance with implementations of the subject matter of this disclosure allows separate activation of the pull-up network of one bitcell and the pull-down network of another bitcell coupled to the same sense amplifier circuitry. With this reconfiguration by independent address control of the true wordline and complement wordline, any pull-up network can be regrouped with any pull-down network sharing a sense amplifier. Control circuitry can output data from different bitcells into the sense amplifier which reads the data as if it came from the same bitcell. This reconfigurability allows for a much larger effective array size for the entropy source without actually increasing the size (and therefore the area and power requirements of) the array. For example, a conventional 1 kB array which was arranged as a 16×64 bitcell array could function like a 16×16×64 bitcell array.

This reconfigurability also allows for generating a new key from a device after it has been compromised. Additionally, this reconfigurability allows for data obfuscation which makes it difficult for an adversary attempting to access the entropy source to obtain the key in the first place. An adversary attempting to probe every transistor in the array would now need to compare every pull-up network along a bitline to every pull-down network along the same bitline.

The reconfigurability allows for the values read out from the bitcell array for creating the PUF key to change and generate new PUF keys from the same bitcell array. For example, while activating the pull-up network of a first bitcell with the pull-down network of a second bitcell may read a logical value '0,' activating the same pull-up network of the first bitcell with a pull-down network from a different third bitcell may read a logical value '1.'

The previous key data may still physically exist in the device but can be invalidated in software to prevent it being used for authentication.

In some implementations, activating the pull-up network of a first bitcell with the pull-down network of a second bitcell may read out an unstable and therefore unusable value, while activating the same pull-up network of the first bitcell with a pull-down network from a different (e.g., third) bitcell may read a stable value.

In some implementations, the pull-up and pull-down networks may be selected for pairing based on the contribution of each. In order to avoid a read-out which is more likely to produce a logical '0' or a logical '1,' and therefore increase predictability, the contribution of each pull-up and pull-down network may be measured. In some implementations, measuring the contribution of each pull-up network or pull-down network of each bitcell in the array is done by measuring the voltage of each network of each bitcell independently. Pairings may then be selected in a manner that ensures that each pairing of each pull-up network and pull-down network is of near-equal contribution. In some implementations, this is done by defining a threshold contribution level difference between each pull-up and pull-down network that must be observed before a pairing can be selected.

The subject matter of this disclosure may be better understood by reference to FIGS. 1-6.

FIG. 1 illustrates regrouping of bitcells within an array along a bitline and complement bitline, in accordance with the subject matter of this disclosure.

Bitcell array 100 contains four bitcells along one bitline column. The bitline column includes true bitline 101 and complement bitline 102. All four bitcells are connected to each of true bitline 101 and complement bitline 102. Each bitcell is also connected to its respective wordline row 103. Each bitcell contains a pull-up and pull-down network.

In the first configuration, pull-down network 104 is activated at the same time as pull-up network 105, which are both located within the bitcell found along wordline row 0 (WL<0>). Wordline row 0 is made up of a true wordline 0 and complement wordline 0. Pull-down network 104 is activated by true wordline 0 while pull-up network 105 is activated by complement wordline 0. In the second configuration, pull-down network 104 is activated at the same time as pull-up network 106. Pull-down network 104 is within the bitcell found along wordline row 0 while pull-up network 106 is within the bitcell found along wordline row 1 (e.g., an adjacent row of bitcells), in contrast with conventional systems where the pull-up network and pull-down network must be a from the same bitcell. Wordline row 0 is made up of a true wordline 0 and complement wordline 0. Wordline row 1 is made up of a true wordline 1 and complement wordline 1. Pull-down network 104 is activated by true wordline 0 while pull-up network 106 is activated by complement wordline 1.

This regrouping may result in a flipped data state. For example, the first configuration may read as a logical '0' and the second arrangement could read as a logical '1.'

Figure 2:
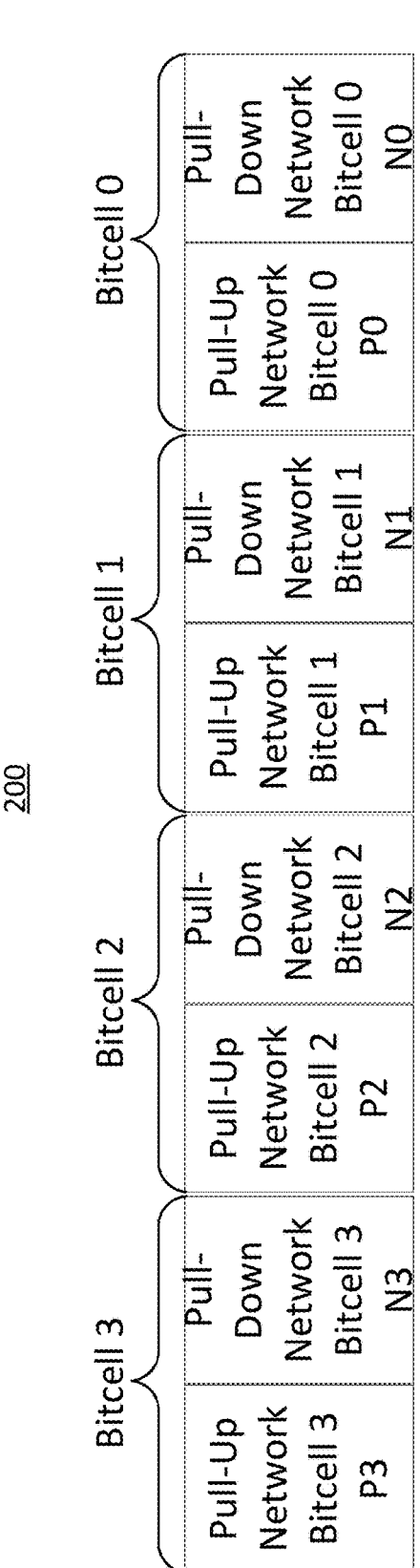
FIG. 2 illustrates a four bitcell array with the pull-up and pull-down networks of each bitcell, in accordance with the subject matter of this disclosure.

FIG. 2 illustrates a four-bitcell array 200, showing the pull-up and pull-down networks of each bitcell, in accordance with the subject matter of this disclosure. Each pull-up network and pull-down network in the bitcell may be addressed independently of the other. For example, the pull-down network of bitcell 1 is addressed with N1 while the pull-up network of bitcell 1 is addressed with P1, as in a typical system. However, with independent true wordline and complement wordline control, any pull-down network can be paired with any pull-up network. In total, this four-bitcell array can be regrouped into 16 possible combinations: P3N0, P3N1, P3N2, P3N3, P2NO, P2N1, P2N2, P2N3, P1N0, P1N1, P1N2, P1N3, P0N0, P0N1, P0N2, and P0N3, where the P index refers to the pull-up network and the N index refers to the pull-down network.

Figure 3:
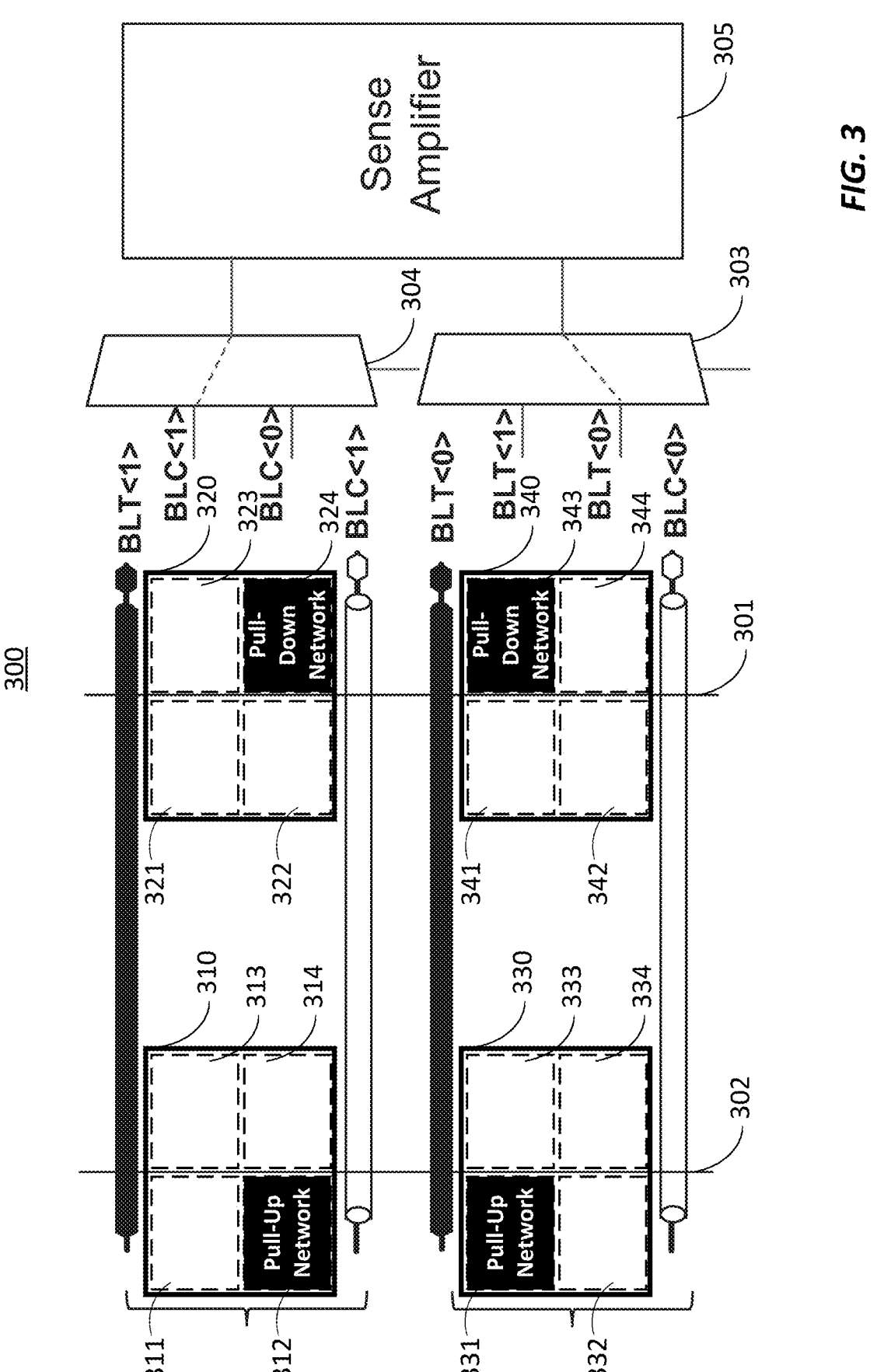
FIG. 3 illustrates regrouping of bitcells within an array, in accordance with the subject matter of this disclosure.

FIG. 3 illustrates regrouping of bitcells within an array, in accordance with the subject matter of this disclosure. Reconfigurability is limited to the bitcells connected to a sense amplifier. Reconfigurability is limited to one bitline column unless more than one column can be connected to a sense amplifier, such as, e.g., using a multiplexer (MUS).

Bitline column 0 includes true bitline 0 (BLT <0>) and complement bitline 0 (BLC <0>). Bitline column 1 includes true bitline 1 (BLT <1>) and complement bitline 1 (BLC <1>). Each bitline column contains several bitcells indexed by wordline rows 301 and 302. In particular, bitcell 310 and bitcell 330 are along wordline row 302 while bitcell 320 and 340 are along wordline row 301. Wordline row 301 includes a true wordline and complement wordline. Wordline row 302 includes a true wordline and complement wordline.

Each bitcell contains a pull-down and pull-up network. The pull-down network for each bitcell is split into two portions, one connected to the true bitline and the other connected to the complement bitline. The pull-up network for each bitcell is split into two portions, one connected to the true bitline and the other connected to the complement bitline.

Bitcell 310 has a pull-up network made up of pull-up network portion 311, connected to true bitline 1, and pull-up network portion 312, connected to complement bitline 1. Bitcell 310 has a pull-down network made up of pull-down network portion 313, connected to true bitline 1, and pull-down network portion 314, connected to complement bitline 1. The entire pull-up network made up of pull-up network portion 311 and pull-up network portion 312 is connected to the complement wordline of wordline row 302. The entire pull-down network made up of pull-down network portion 313 and pull-down network portion 314 is connected to the true wordline of wordline row 302. Bitcell 320 has a pull-up network made up of pull-up network portion 321, connected to true bitline 1, and pull-up network portion 322, connected to complement bitline 1. Bitcell 320 has a pull-down network made up of pull-down network portion 323, connected to true bitline 1, and pull-down network portion 324, connected to complement bitline 1. Bitcell 330 has a pull-up network made up of pull-up network portion 331, connected to true bitline 0, and pull-up network portion 332, connected to complement bitline 0. The entire pull-up network made up of pull-up network portion 321 and pull-up network portion 322 is connected to the complement wordline of wordline row 301. The entire pull-down network made up of pull-down network portion 323 and pull-down network portion 324 is connected to the true wordline of wordline row 301. Bitcell 330 has a pull-down network made up of pull-down network portion 333, connected to true bitline 0, and pull-down network portion 334, connected to complement bitline 0. The entire pull-up network made up of pull-up network portion 331 and pull-up network portion 332 is connected to the complement wordline of wordline row 302. The entire pull-down network made up of pull-down network portion 333 and pull-down network portion 334 is connected to the true wordline of wordline row 302. Bitcell 340 has a pull-up network made up of pull-up network portion 341, connected to true bitline 0, and pull-up network portion 342, connected to complement bitline 0. Bitcell 340 has a pull-down network made up of pull-down network portion 343, connected to true bitline 0, and pull-down network portion 344, connected to complement bitline 0. The entire pull-up network made up of pull-up network portion 341 and pull-up network portion 342 is connected to the true wordline of wordline row 302. The entire pull-down network made up of pull-down network portion 343 and pull-down network portion 344 is connected to the complement wordline of wordline row 301.

As explained above in connection with FIG. 1, within bitline column 0, the pull-down network of bitcell 340 is activated by activating the true wordline of wordline 301 at the same time as the pull-up network of bitcell 330 is activated by activating the complement wordline of wordline 301. Additionally, within bitline column 1, the pull-down network of bitcell 320 is activated by activating the true wordline of wordline 301 at the same time as the pull-up network of bitcell 310 is activated by activating the complement wordline of wordline 301. The bitcells are read by address multiplexing circuitry 303 and address multiplexing circuitry 304. The address multiplexing circuitry allows for independent control of the true and complement bitlines.

Address multiplexing circuitry 304 receives the read out from the portions of the pull-up and pull-down networks of the bitcells which are connected to the complement bitlines, including portions of pull-up networks 312, 322, 332, and 342 and portions of pull-down networks 314, 324, 334, and 344. The portions of pull-up networks 312 and 322 and portions of pull-down networks 314 and 324 are along bitline complement 1 while the portions of pull-up networks 332 and 342 and portions of pull-down networks 334 and 344 are along bitline complement 0.

Address multiplexing circuitry 303 receives the read out from the portions of the pull-up and pull-down networks of the bitcells which are connected to the true bitlines, including portions of pull-up networks 311, 321, 331, and 341 and portions of pull-down networks 313, 323, 333, and 343. The portions of pull-up networks 311 and 321 and portions of pull-down networks 313 and 323 are along true bitline 1 while the portions of pull-up networks 331 and 341 and portions of pull-down networks 333 and 343 are along true bitline 0.

Address multiplexing circuitry 304 selects one of complement bitline 1 and complement bitline 0. Address multiplexing circuitry 303 selects one of true bitline 1 and true bitline 0. Address multiplexing circuitry 303 and 304 then feed their selections into sense amplifier 305. In this way, multiplexing circuitry allows for independent bitline column control. However, activation of bitcells is still controlled along the wordline rows. Therefore, a portion of a pull-down network along a complement bitline must be activated with the portion of the pull-down network along a true bitline which is indexed by the same wordline row, and similarly for a pull-up network.

For example, in array 300, address multiplexing circuitry 304 selects complement bitline 1 and address multiplexing circuitry 303 selects complement bitline 1. In accordance with methods described in connection with FIG. 1, complement wordline of wordline row 302 is activated, thus activating the pull up network of bitcells 310 and 330. In accordance with methods described in connection with FIG. 1, true wordline of wordline row 301 is activated, thus activating the pull up network of bitcells 320 and 340. Sense amplifier 305 therefore reads data from pull-up portions 312 and 331 and pull-down portions 324 and 343.

In this way, address multiplexing circuitry allows for reading of portions of pull-up networks along one bitline with portions of pull-up networks along another bitline, and similarly for pull-down networks.

In some implementations, the method of multiplexing to allow contributions from multiple bitlines may be used independently of the methods described in connection with FIG. 1. For example, only wordline row 301 may have been activated and therefore sense amplifier 305 would read data from pull-up portions 322 and 341 and pull-down portions 324 and 343.

Figure 4:
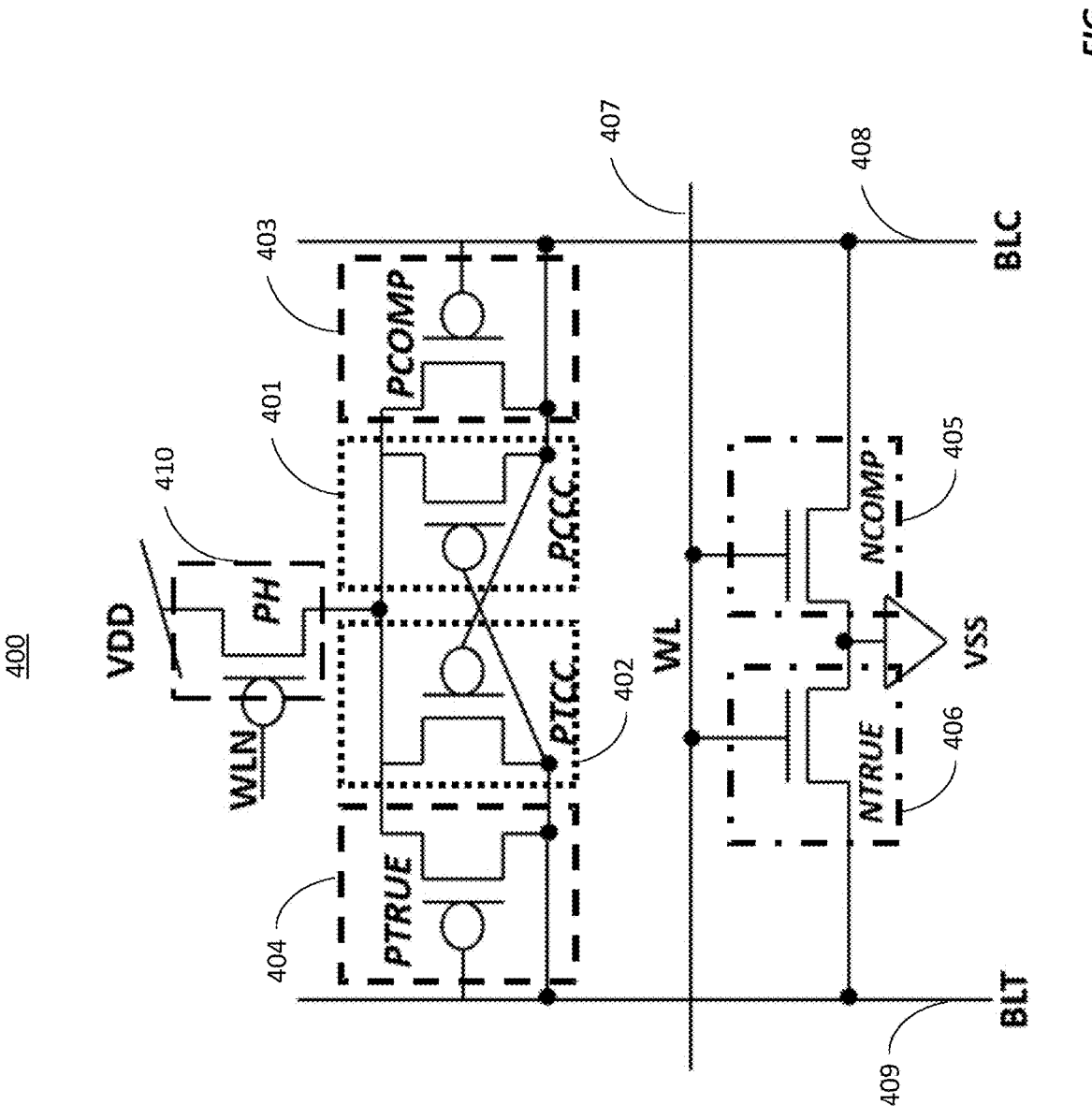
FIG. 4 illustrates a pre-amplifier PUF bitcell, in accordance with the subject matter of this disclosure.

FIG. 4 illustrates a pre-amplifier PUF bitcell, in accordance with the subject matter of this disclosure. Bitcell 400 contains seven transistors, but the PUF data comes from the six core devices: diode-configured PFETs PTRUE 404 and PCOMP 403, cross-coupled PFETs PTCC 402 and PCCC 401, and NFETs NTRUE 406 and NCOMP 405. Access transistor PH 410 enables activation of bitcell 400 when multiple bitcells are connected along the same bitline. Access transistor PH 410 is connected to source voltage VDD. Bitcell 400 is connected to a bitline including true bitline (BLT) 409 and complement bitline (BLC) 408 and wordline WL 407.

The diode-configured PFETs, PTRUE 404 and PCOMP 403, have two independent matched pairs to increase randomness and repeatability. PTRUE 404 and PCOMP 403 are arranged such that the gate is connected to BLT 408 and drain is connected to BLC 408 with the source terminal connected to access transistor PH 410.

The cross-coupled PFETs, PTCC 402 and PCCC 401, are amplifying transistors used to pull apart the voltages of BLT 409 and BLC 408 during sensing. PTCC 402 gate control connects to BLC 408 while PCCC 401 gate control connects to BLT 409, which allows for amplification of the separation and a maximum differential voltage between BLT 409 and BLC 408.

The NFETs, NTRUE 406 and NCOMP 405, share a common gate to WL 507 and a common source voltage of 0V. The drain voltage of NTRUE 406 connects to BLT 409 while the drain voltage of NCOMP connects to BLC 408.

When bitcell 400 is read, WL 407 is activated to both NFETs, NTRUE 406 and NCOMP 405. PTRUE and PCOMP are configured to set the BLT 409 and BLC 408 voltages to approximately a threshold voltage (VTH) below VDD. Cross-coupled PFETS PTCC 402 and PCCC 401 each pull BLC 408 and BLT 409 respectively towards VDD. The lower of the voltages of the BLT 409 and BLC 408 generates more overdrive on the other side's PFET. This brings the "weaker" side toward VDD.

Figure 5:
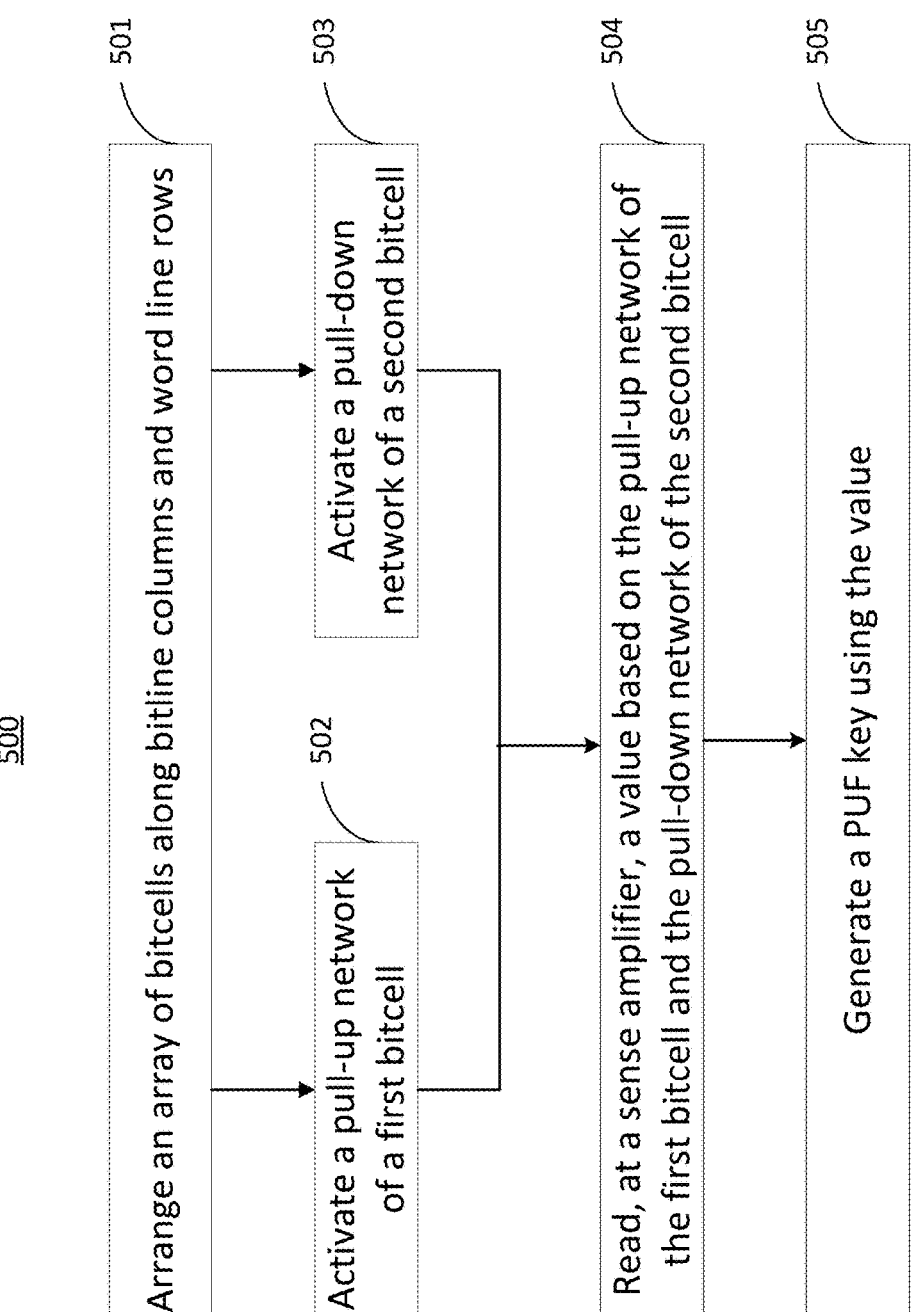
FIG. 5 is a flow diagram illustrating a method of generating a PUF key using a value read from an array of bitcells according to implementations of the subject matter of this disclosure.

FIG. 5 is a flow diagram illustrating a method 500 of generating a PUF key using a value read from an array of bitcells according to implementations of the subject matter of this disclosure.

At 501, an array of bitcells is arranged along bitline columns and wordline rows. Each wordline row is defined by respective pairs of true and complement wordlines. Each bitline is defined by respective pairs of true and complement bitlines. Each bitcell contains a pull-down network coupled to one of the true wordlines and a pull-up network coupled to one of the complement wordlines.

At 502, a pull-up network of a first bitcell is activated by activating the true wordline for the bitcell. At 503, a pull-down network of a second bitcell is activated by activating the complement wordline for the bitcell. In some implementations, this activation occurs in accordance which the description of reading bitcell 400 with respect to FIG. 4.

At 504, a value based on the pull-up network of the first bitcell and the pull-down network of the second bitcell is read by a sense amplifier. The value indicates a logical '0' or logical '1.' The sense amplifier is coupled to a true bitline and complement bitline. At 505, the value is used to generate a PUF key. In some implementations, the PUF key may be generated using cryptographic algorithms.

Figure 6:
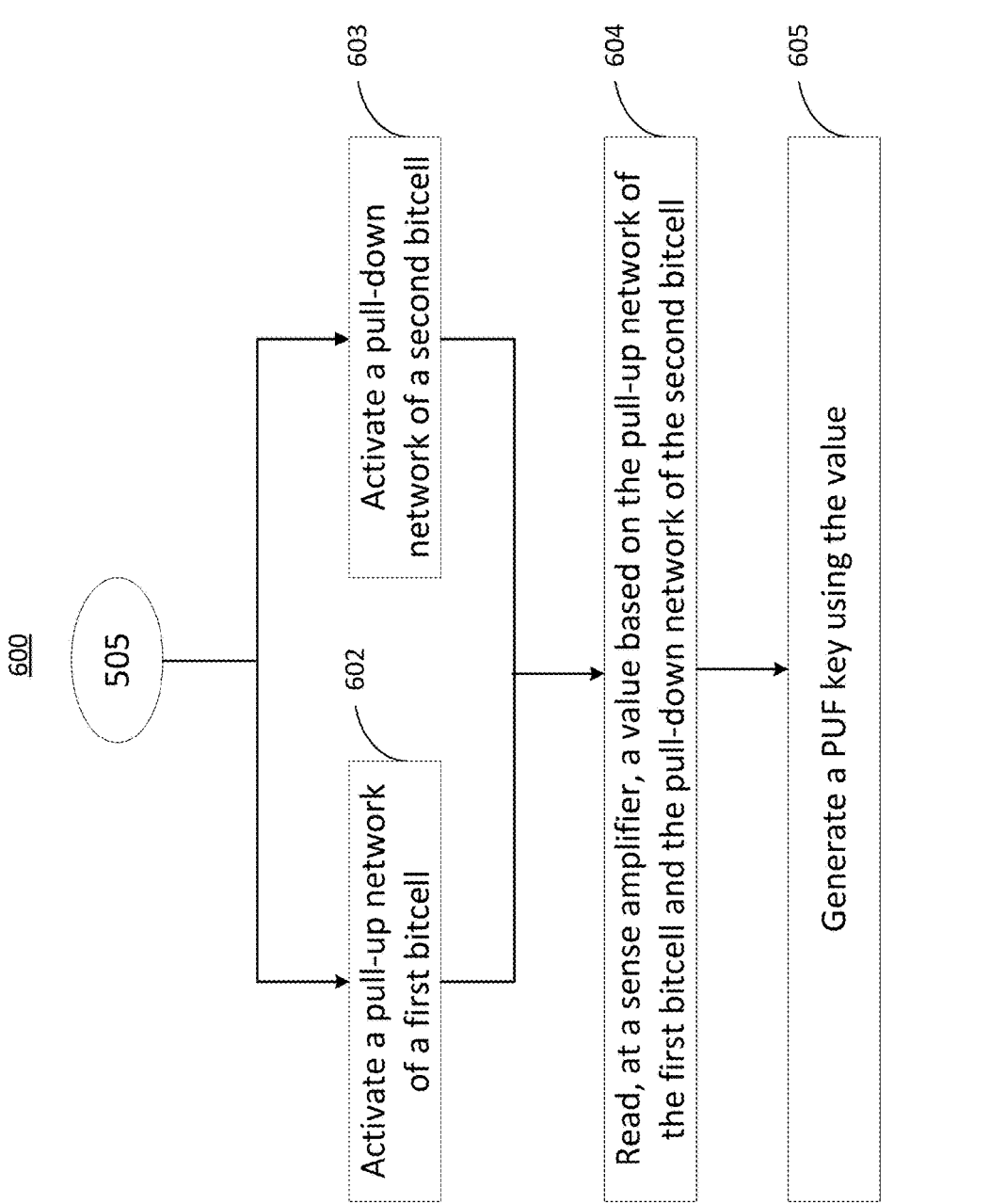
FIG. 6 is a flow diagram illustrating a method of generating a new PUF key using a value read from an array of bitcells according to implementations of the subject matter of this disclosure.

FIG. 6 is a flow diagram illustrating a method of generating a new PUF key using a value read from an array of bitcells according to implementations of the subject matter of this disclosure.

After 505, the same bitcell array from method 500 is activated. At 602, a pull-up network of the same first bitcell is activated by activating the true wordline for the bitcell. At 603, a pull-down network of a different third bitcell is activated by activating the complement wordline for the bitcell. In some implementations, the wordline which is activated may be selected by incrementing through all wordlines in the array in order to activate every bitcell eventually.

At 604, a new value based on the pull-up network of the first bitcell and the pull-down network of the third bitcell is read by a sense amplifier. The new value indicates a logical '0' or logical '1.' In some implementations, this new value may be equivalent to the value read at 504. In some implementations, this new value may be different from the value read at 504. The sense amplifier is coupled to a true bitline and complement bitline. At 605, the new value is used to generate a new PUF key from the same array of bitcells.

Thus it is seen that a PUF key generated by a reconfigurable bitcell array entropy source has been provided which may generate multiple PUF keys from one entropy source.

As used herein and in the claims which follow, the construction "one of A and B" shall mean "A or B."

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A method of generating a physical unclonable function (PUF) key using a value read from an array of bitcells, the method comprising:

arranging the array of bitcells in respective rows defined by respective pairs of true and complement wordlines and in columns defined by respective pairs of true and complement bitlines, each bitcell in the array of bitcells having a pull-up network coupled to one of the complement wordlines and to the true and complement bitlines, and having a pull-down network coupled to one of the true wordlines and to the true and complement bitlines;

activating a pull-up network of a first bitcell in the array of bitcells by activating a first complement wordline corresponding to the pull-up network;

activating a pull-down network of a second bitcell in the array of bitcells by activating a first true wordline corresponding to the pull-down network, wherein the second bitcell is different from the first bitcell;

reading a first value based on the pull-up network of the first bitcell and the pull-down network of the second bitcell using a sense amplifier coupled to a first true bitline and a first complement bitline; and generating a first PUF key using the first value;

after generating the first PUF key using the first value, activating the pull-up network of the first bitcell in the array of bitcells by activating the first complement wordline corresponding to the pull-up network;

activating a pull-down network of a third bitcell in the array of bitcells by activating a second true wordline corresponding to the pull-down network, wherein the third bitcell is different from the first and second bitcells;

reading a second value based on the pull-up network of the first bitcell and the pull-down network of the third bitcell using a sense amplifier coupled to a first true bitline and a first complement bitline; and generating a second PUF key using the second value.

2. The method of generating a PUF key according to claim 1, wherein the first true bitline and the first complement bitline are members of one respective pair of true and complement bitlines.

3. The method of generating a PUF key according to claim 1, wherein the first true bitline is a member of a first respective pair of true and complement bitlines, and the first complement bitline is a member of a second respective pair of true and complement bitlines.

4. The method of generating a PUF key according to claim 1 further comprising determining, by the sense amplifier, that only one of the first value and the second value is stable.

5. The method of generating a PUF key according to claim 1 further comprising measuring the contribution of each pull-up network of each bitcell in the array and the contribution of each pull-down network of each bitcell in the array to determine which complement wordline corresponding to a pull-up network and which true wordline corresponding to a pull-down network to activate at the same time to generate a bit value.

6. The method of generating a PUF key according to claim 5 further comprising:

determining that the pull-up network of the first bitcell and the pull-down network of the second bitcell have contributions within a threshold level of each other; and selecting the pull-up network of the first bitcell and the pull-down network of the second bitcell.

7. The method of generating a PUF key according to claim 5 wherein measuring the contribution of each pull-up network of each bitcell in the array and the contribution of each pull-down network of each bitcell in the array comprises measuring the voltage of each pull-up network of each bitcell in the array and the voltage of each pull-down network of each bitcell in the array.

8. A method of generating a physical unclonable function (PUF) using a value read from an array of bitcells, the method comprising:

arranging the array of bitcells in respective rows defined by respective pairs of true and complement wordlines and in columns defined by respective pairs of true and complement bitlines, each bitcell in the array of bitcells having a pull-up network coupled to one of the complement wordlines and to the true and complement bitlines, and having a pull-down network coupled to one of the true wordlines and to the true and complement bitlines;

activating a pull-up network of a first bitcell in the array of bitcells by activating a first complement wordline corresponding to the pull-up network;

activating a pull-down network of a second bitcell in the array of bitcells by activating a first true wordline corresponding to the pull-down network, wherein the second bitcell is different from the first bitcell;

reading a first value based on the pull-up network of the first bitcell and the pull-down network of the second bitcell using a sense amplifier coupled to a first true bitline and a first complement bitline;

activating a pull-up network of a third bitcell in the array of bitcells by activating a second complement wordline corresponding to a pull-up network, wherein the third bitcell is different from the first and second bitcells;

activating a pull-down network of a fourth bitcell in the array of bitcells by activating a second true wordline corresponding to the pull-down network, wherein the fourth bitcell is different from the first, second, and third bitcells;

reading a second value based on the pull-up network of the third bitcell and the pull-down network of the fourth bitcell using a sense amplifier coupled to the first true bitline and the first complement bitline; and generating a first physical unclonable function (PUF) key using the first value and the second value.

9. An entropy source for generating a PUF key comprising:

an array of bitcells arranged in respective rows defined by respective pairs of true and complement wordlines and in columns defined by respective pairs of true and complement bitlines, wherein each bitcell in the array of bitcells comprises:

a pull-up network coupled to one of the complement wordlines and to the true and complement bitlines; and a pull-down network coupled to one of the true wordlines and to the true and complement bitlines;

control circuitry configured to:

activate a pull-up network of a first bitcell in the array of bitcells by activating a first complement wordline corresponding to the pull-up network; and activate a pull-down network of a second bitcell in the array of bitcells by activating a first true wordline corresponding to the pull-down network, wherein the second bitcell is different from the first bitcell;

a sense amplifier coupled to a first true bitline and a first complement bitline configured to read a first value based on the pull-up network of the first bitcell and the pull-down network of the second bitcell; and key generation circuitry configured to generate a first physical unclonable function (PUF) key using the first value, wherein, after generating the first PUF key using the first value, the control circuitry is configured to activate the pull-up network of the first bitcell in the array of bitcells by activating the first complement wordline corresponding to the pull-up network, and activate a pull-down network of a third bitcell in the array of bitcells by activating a first true wordline corresponding to the pull-down network, the third bitcell is different from the first and second bitcells, the sense amplifier is further configured to read a second value based on the pull-up network of the first bitcell and the pull-down network of the third bitcell; and, the key generation circuitry further configured to generate a second PUF key using the second value.

10. The entropy source for generating a PUF key of claim 9 further comprising multiplexing circuitry configured to couple the sense amplifier to the first true bitline and the first complement bitline.

11. The entropy source for generating a PUF key of claim 10, wherein the multiplexing circuitry is further configured to, when coupling the sense amplifier to the first true bitline and the first complement bitline, select the first true bitline and the first complement bitline such that they are members of one respective pair of true and complement bitlines.

12. The entropy source for generating a PUF key of claim 10, wherein the multiplexing circuitry is further configured to, when coupling the sense amplifier to the first true bitline and the first complement bitline, select the first true bitline such that it is a member of a first respective pair of true and complement bitlines, and select the first complement bitline such that it is a member of a second respective pair of true and complement bitlines.

13. The entropy source for generating a PUF key of claim 10 wherein the sense amplifier is further configured to measure the contribution of each pull-up network of each bitcell in the array and the contribution of each pull-down network of each bitcell in the array to determine which complement wordline corresponding to a pull-up network and true wordline corresponding to a pull-down network to activate at the same time to generate a bit value.

14. The entropy source for generating a PUF key of claim 13 wherein the multiplexing circuitry is further configured to:

determine that the pull-up network of the first bitcell and the pull-down network of the second bitcell have contributions within a threshold level of each other; and select the pull-up network of the first bitcell and the pull-down network of the second bitcell.

15. The entropy source for generating a PUF key of claim 13 wherein the sense amplifier is further configured to, when measuring the contribution of each pull-up network of each bitcell in the array and the contribution of each pull-down network of each bitcell in the array, measure the voltage of each pull-up network of each bitcell in the array and the voltage of each pull-down network of each bitcell in the array.

16. The entropy source for generating a PUF key of claim 9 wherein the sense amplifier is further configured to determine that only one of the first value and the second value is stable.

17. The entropy source for generating a PUF key of claim 9, wherein the control circuitry is further configured to:

activate a pull-up network of the third bitcell in the array of bitcells by activating a second complement wordline corresponding to the pull-up network; and activate a pull-down network of a fourth bitcell in the array of bitcells by activating a second true wordline corresponding to the pull-down network, wherein the fourth bitcell is different from the first, second, and third bitcells;

the sense amplifier further configured to read a third value based on the pull-up network of the third bitcell and the pull-down network of the fourth bitcell; and the key generation circuitry is further configured to generate the first PUF key also using the third value.

\* \* \* \* \*